(12) United States Patent
Sun et al.

(10) Patent No.: US 6,732,349 B1
(45) Date of Patent: May 4, 2004

(54) METHOD AND APPARATUS FOR IMPROVING PIP COVERAGE IN PROGRAMMABLE LOGIC DEVICES

(75) Inventors: Richard Yachyang Sun, Mountain View, CA (US); Sandor S. Kalman, Santa Clara, CA (US); Sudip K. Nag, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 49 days.

(21) Appl. No.: 10/231,900

(22) Filed: Aug. 29, 2002

(51) Int. Cl.$^7$ ............................................. G06F 17/50
(52) U.S. Cl. ............................. 716/16; 716/4; 716/16
(58) Field of Search .................... 716/4–5, 12, 16–17; 714/725

(56) References Cited

U.S. PATENT DOCUMENTS

| | | | |
|---|---|---|---|
| 5,761,484 A | * 6/1998 | Agarwal et al. | 716/16 |
| 6,086,629 A | * 7/2000 | McGettigan et al. | 716/12 |
| 6,185,724 B1 | * 2/2001 | Ochotta | 716/16 |
| 6,501,297 B1 | * 12/2002 | Kong | 326/41 |
| 6,526,558 B2 | * 2/2003 | Agrawal et al. | 716/16 |

* cited by examiner

*Primary Examiner*—Matthew Smith
*Assistant Examiner*—Paul Dinh
(74) *Attorney, Agent, or Firm*—H. C. Chan

(57) ABSTRACT

Routing algorithms can be modified to increase the number of programmable interconnect points (PIPs) used in a routing pattern. A file is set up to store information on whether a PIP has been covered. The cost of a node can be decreased by a predetermined value if two nodes are connected by an uncovered PIP. In another embodiment, a file is set up to store a count for each PIP. The count is increased each time the PIP is used in a routing. The cost of a node can be increased by multiplying a predetermined value and the count of a PIP associated with the node.

9 Claims, 6 Drawing Sheets

METHOD AND APPARATUS FOR IMPROVING PIP COVERAGE IN PROGRAMMABLE LOGIC DEVICES

FIELD OF THE INVENTION

The present invention relates to programmable logic device, and more particularly to coverage of programmable interconnect points in a programmable logic device.

BACKGROUND OF THE INVENTION

Programmable logic devices (PLDS) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic devices, called the field programmable gate array (FPGA), is very popular because of a superior combination of capacity, flexibility and cost.

A typical FPGA comprises a large number of configurable logic blocks (CLBs) surrounded by input-output blocks and interconnectable through a routing structure. The routing structure comprises many interconnect wires and associated programmable interconnect points (PIPs). In one embodiment, a PIP contains a pass transistor that can be turned on and off, thereby allowing an associated interconnect wire to be either connected or disconnected (depending on the state of the transistor) to other circuit elements. The CLBs and routing structure of the FPGA are arranged in an array or in a plurality of sub-arrays wherein respective CLBs and associated portions of the routing structure are placed edge to edge in what is commonly referred to as a tiled arrangement. The CLB portion of a tile comprises a plurality of primitive cells which may be interconnected in a variety of ways to perform a desired logic function. For example, a CLB may comprise a plurality of lookup tables (LUTS), multiplexers and registers. The CLBs, IOBs, and interconnect structure are typically programmed by loading a stream of configuration data (bitstream) into internal configuration memory cells that define how the CLBS, IOBs, and interconnect structure are configured. The configuration bitstream may be read from an external memory (e.g., an external PROM). The collective states of the individual memory cells then determine the function of the FPGA.

It can be seen from above that a typical FPGA is a very complex IC device. For example, some FPGAs in the Virtex-II family, marketed by Xilinx, Inc. of San Jose, Calif., contain several million gates. In addition, there are millions of interconnect lines. A FPGA may be unusable when a very small number of gates, PIPs or interconnect lines malfunction (e.g., due to fabrication errors, fabrication defects, or physical failure). Thus, it is important to test the FPGA to determine if there are defects.

One criteria of a successful testing is whether at least a predetermined percentage of PIPs have been tested. If not enough PIPs have been tested, the chance that a user design may use one of the untested PIPs (which may be faulty) is unacceptably high. Consequently, there is a need to be able to test as many PIPs as possible efficiently.

SUMMARY OF THE INVENTION

The present invention involves methods for increasing the number of PIPs that can be covered in a routing. A file is set to store information indicating whether a PIP has been covered. A predetermined value (used for modifying the cost) is inputted. The node are then routed. The routing routine includes expanding from a first node to a second node. A modified cost for the second node (equal to cost of the first node plus base cost of the second node minus the inputted value) is calculated. This modified cost is applied if the first node and a second node are connected through an uncovered PIP and if the modified cost is lower than the cost of the second node. Routing is performed using the cost calculated above.

In another embodiment of the present invention, a signal from a routed pattern is ripping up. Routing is performed on the ripped up signal by applied the above method. Other signals in the routed pattern can also be ripped up and rerouted.

In yet another embodiment of the present invention, a different file is set up. This file stores a "count" for each PIP. The nodes are then routed. A new cost is calculated by adding to the base cost a term equal to a product of the count and a predetermined value. After a routing run, the file is updated by increasing the count of each visited PIP by one.

The above summary of the present invention is not intended to describe each disclosed embodiment of the present invention. The figures and detailed description that follow provide additional example embodiments and aspects of the present invention.

DETAILED DESCRIPTION OF THE INVENTION

The present invention relates to testing of programmable logic devices. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

A routing program (router) is generally used to find optimal connections between different circuit components in order to implement a circuit design in a PLD. The locations of the circuit components are generally determined by a placement program (placer). In a FPGA, the connection between components is provided by wires that are turned on or off by their associated PIPs. In the algorithm of many routers, a directed routing graph is used to model the FPGA device as each wire and PIP maps to a node and arc, respectively. Costs are assigned to the nodes to guide a router to find optimal connections. In conventional applications, "optimal" may mean short paths for fast signal communication. However, in the present invention, routers are used as a tool to efficiently cover as many PIPs as possible.

Figure 1:
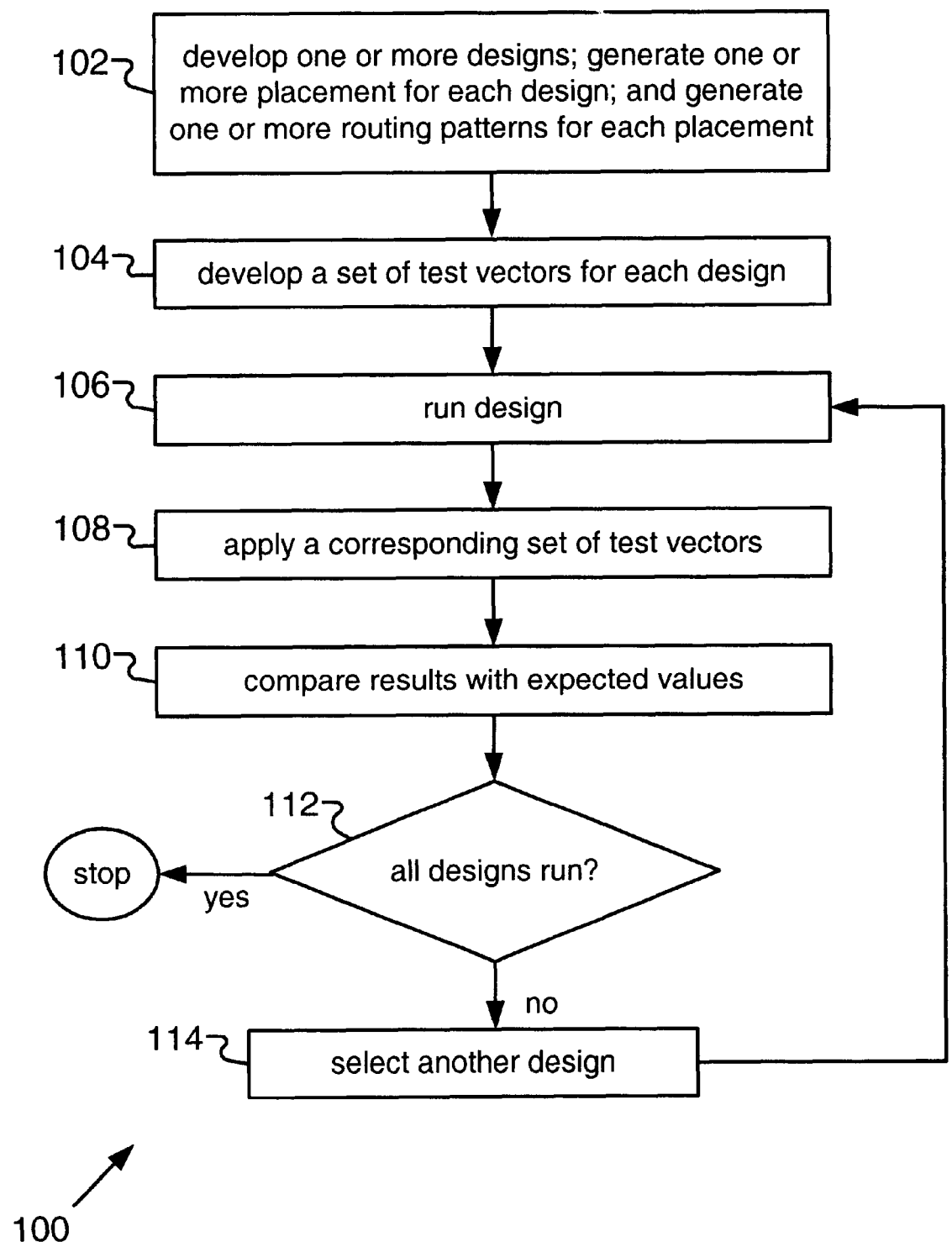
FIG. 1 is a flow chart showing a testing method of the present invention.

FIG. 1 is a flow chart of a process 100 that can be used to implement the present invention. In step 102, one or more designs are developed. Each of these designs are placed. It is possible to have more than one placement to implement a design. Each placement is routed by a router to generate routing patterns. Again, more than one routing pattern can be obtained for each placement. An associated configuration file is generated for each routing pattern. The configuration file will be used to configure the components (e.g., PIPs, LUTs, etc.) of the PLD. In step 104, a set of test vectors is developed for each design. These test vectors will be applied as stimuli to the input/output pins of the PLD. The output results are observed to determine whether the PLD works properly. In step 106, a design is run. This involves loading the corresponding configuration file into the PLD. In step 108, a corresponding set of test vector is applied. In step 110, the results are compared with expected values. In step 112, process 100 determines whether all the designs have been run. If not all the designs have been run, another design is selected (step 114). Process 100 branches back to step 106 to execute this new design. If all the design have been run, process 100 stops. The results can be used to determine whether the PLD is a good IC.

In process 100, it is desirable to exercise all the PIPs after all the designs are run. However, it should be noted that in some applications not all the PIPs need to be tested.

The above described steps, such as configuring the PLD under test and the subsequent testing process, consume engineering time that directly contributes to costs. It is economical to use as few routing patterns as possible. In the present invention, the term "covered" PIP refers to a PIP that has been selected in a routing pattern, and the term "uncovered" PIP refers to a PIP that has not been selected in any routing pattern. One aspect of the present invention is to develop ways for a router to develop routing patterns that can pass through as many uncovered PIPs as possible. This would allow testing using a small number of routing patterns.

One method to achieve this aspect of the invention is to favor selection of uncovered PIPs during routing. This can be achieved by changing the costs of various nodes. In a router, each node of a routing graph is associated with a base cost whose value is a weighted measure of the length of the corresponding wire segment. In this invention, a symbol, BaseCost(v), is used to denote the base cost of a node v. Also, each node of the routing graph is associated with another cost whose value is equal to the minimum path cost among all paths examined so far between the source node and this node. A symbol, Cost(v), is used to denote such cost of node v. These costs are used to guide the router, which generally selects a node having the lowest cost in its expand-list. Note that the cost of a source node is defined to be zero and the cost of all other nodes are initially set to be positive infinity.

Figure 2A:
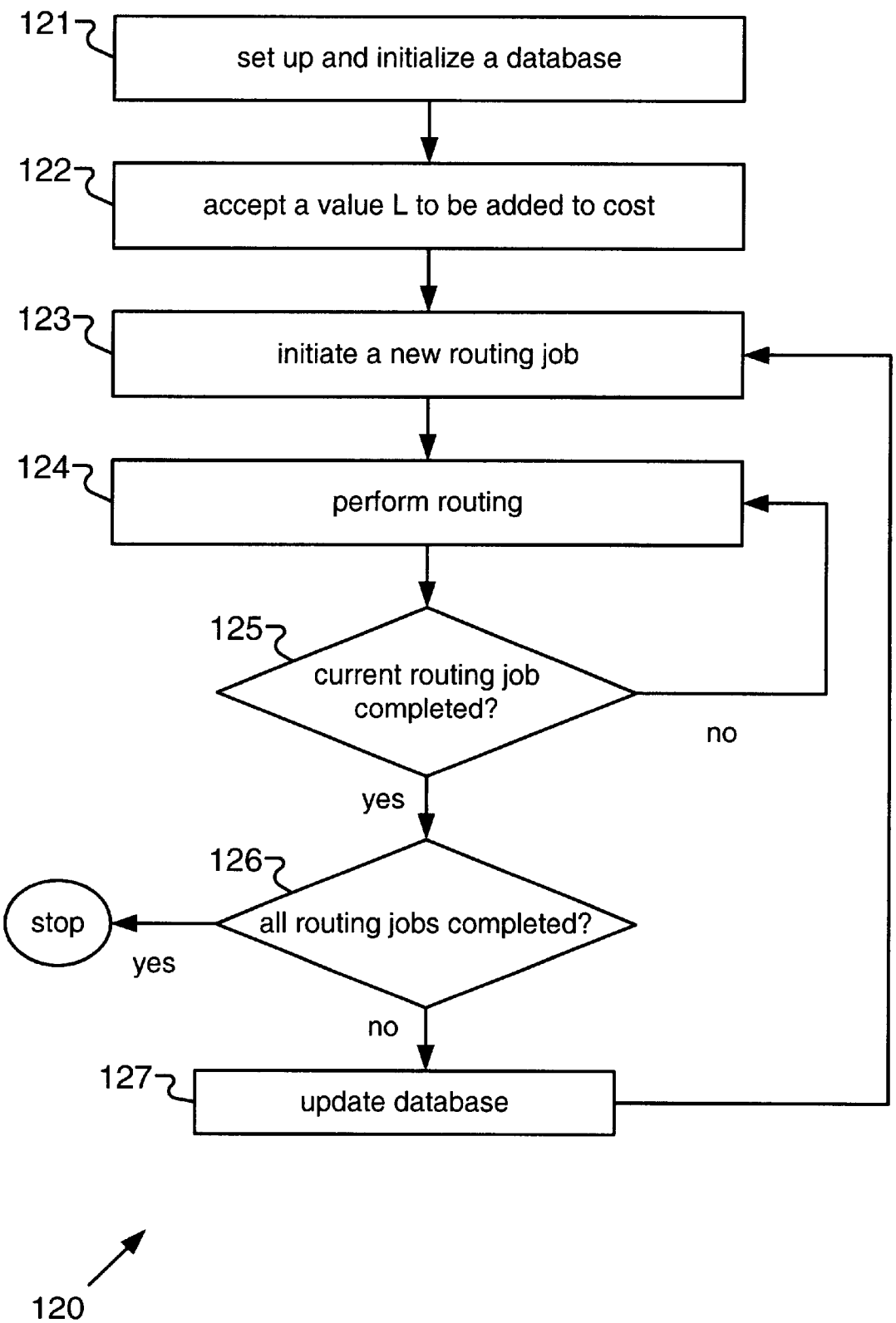
FIG. 2A is a flow chart showing an operation of the present invention that can increase the number of PIPs covered in a routing.

FIG. 2A is a flow chart showing an operation 120 of the present invention. In step 121, a database (or other type of files) is set up to store information about each PIP (e.g., whether it is covered or uncovered). The database is initialized by setting all PIPs as uncovered. In step 122, operation 120 accepts a cost value (L) from a user (or generated by other operations). This value is used to modify the expansion process of a router so that, among all paths from the source node to any specific node, paths with more uncovered PIPs should have smaller cost than those with fewer uncovered PIPs. In a preferred embodiment, the value of L should be large. In step 123, a new routing job is initiated. In step 124, routing is performed. In step 125, operation 120 determines whether the current routing job is completed. If it is not completed, operation 120 jumps back to step 124 to perform routing. If the current routing job is completed, operation determines whether all routing jobs have been completed (step 126). One criteria for this determination is whether all the PIPs have been covered. If all the routing jobs have been completed, operation 120 stops. If not all the routing jobs have been completed, the database is updated (step 127). Operation 120 then jumps back to step 123 to initiate a new routing job.

Figure 2B:
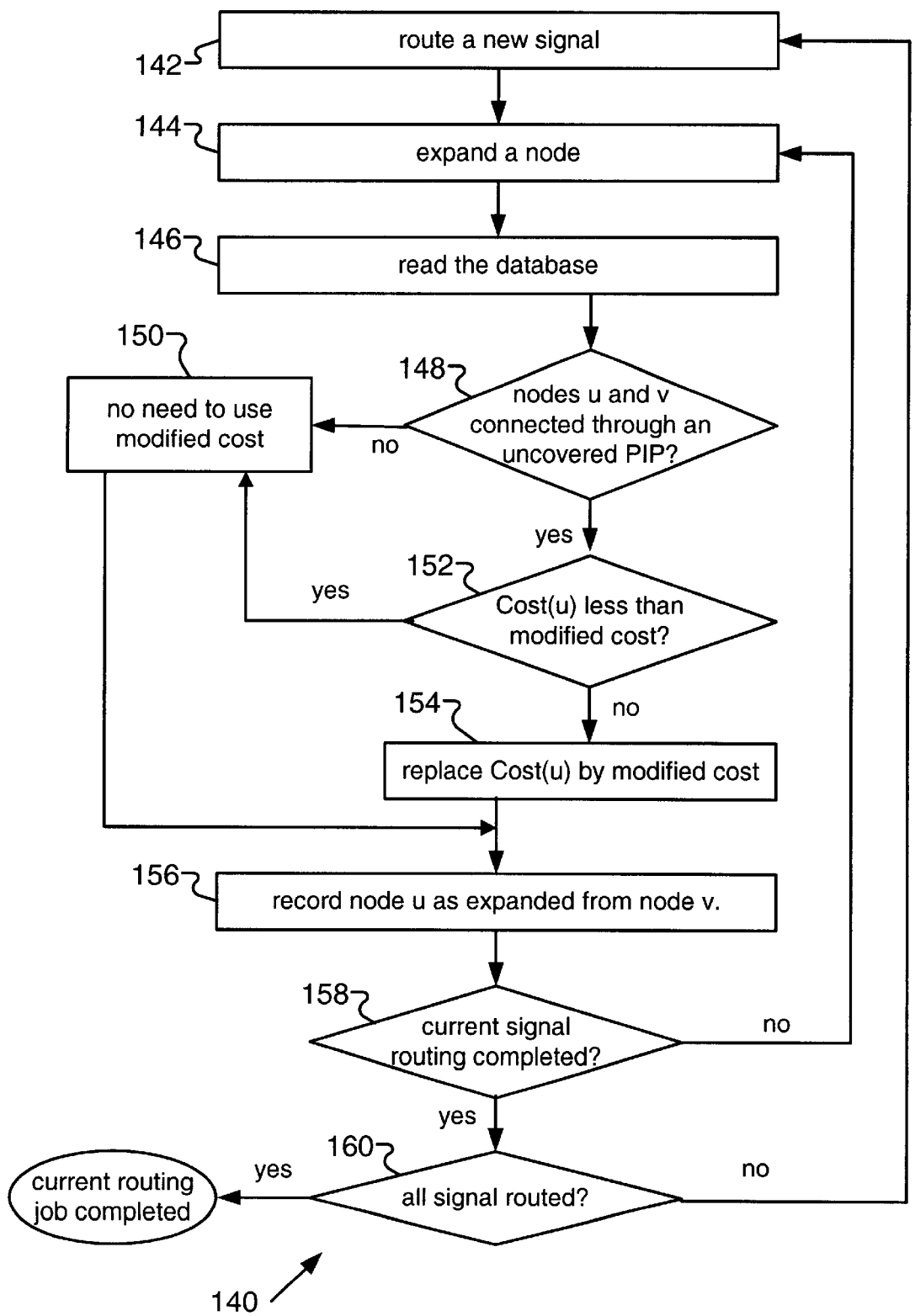
FIG. 2B is a flow chart showing the details of a portion of the routing operation of FIG. 2A.

FIG. 2B is a flow chart 140 showing the details of steps 124 and 125 in FIG. 2A. In step 142, a new signal is routed. In step 144, a node (e.g., node u) is expanded from a minimum cost node (e.g., node v) in an expansion list. In step 146, the database is read. In step 148, it is determined whether the nodes u and v are connected through an uncovered PIP. In this step, the information in the database is used. If the connection is not through an uncovered PIP, conventional cost can be used and there is no need to apply the L value to the cost (step 150). If the connection is through an uncovered PIP, the cost of node u, Cost(u), is compared to a modified cost, Cost(v)+BaseCost(u)−L (step 152). If the modified cost is larger than Cost(u), there is no change to Cost(u), thus step 152 goes to step 150. If the modified cost is smaller than Cost(u), then Cost(u) is replaced by this modified cost (step 154).

After the cost is assigned (either via step 150 or step 154), node u is recorded as being expanded from node v (step 156). In step 158, it is determined whether the current signal routing has been completed. If the signal routing is not completed, a new node is expanded (i.e., return to step 144). If the signal routing is completed, it is determined whether all the signals have been routed (step 160). If not all the signals have been routed, a new signal is obtained (i.e., return to step 142). If all the signals have been routed, the current routing job is completed.

By performing the above operations for every expansion through an uncovered PIP, the node cost of every node during the expansion will have been subtracted by L as many times as the maximum number of uncovered PIPs along every path that has been expanded from the source to the node. Therefore, when the load node is extracted from the expand-list at the end of the expansion, the path constructed will have the most uncovered PIPs among every path between the source and the load.

Figure 3:
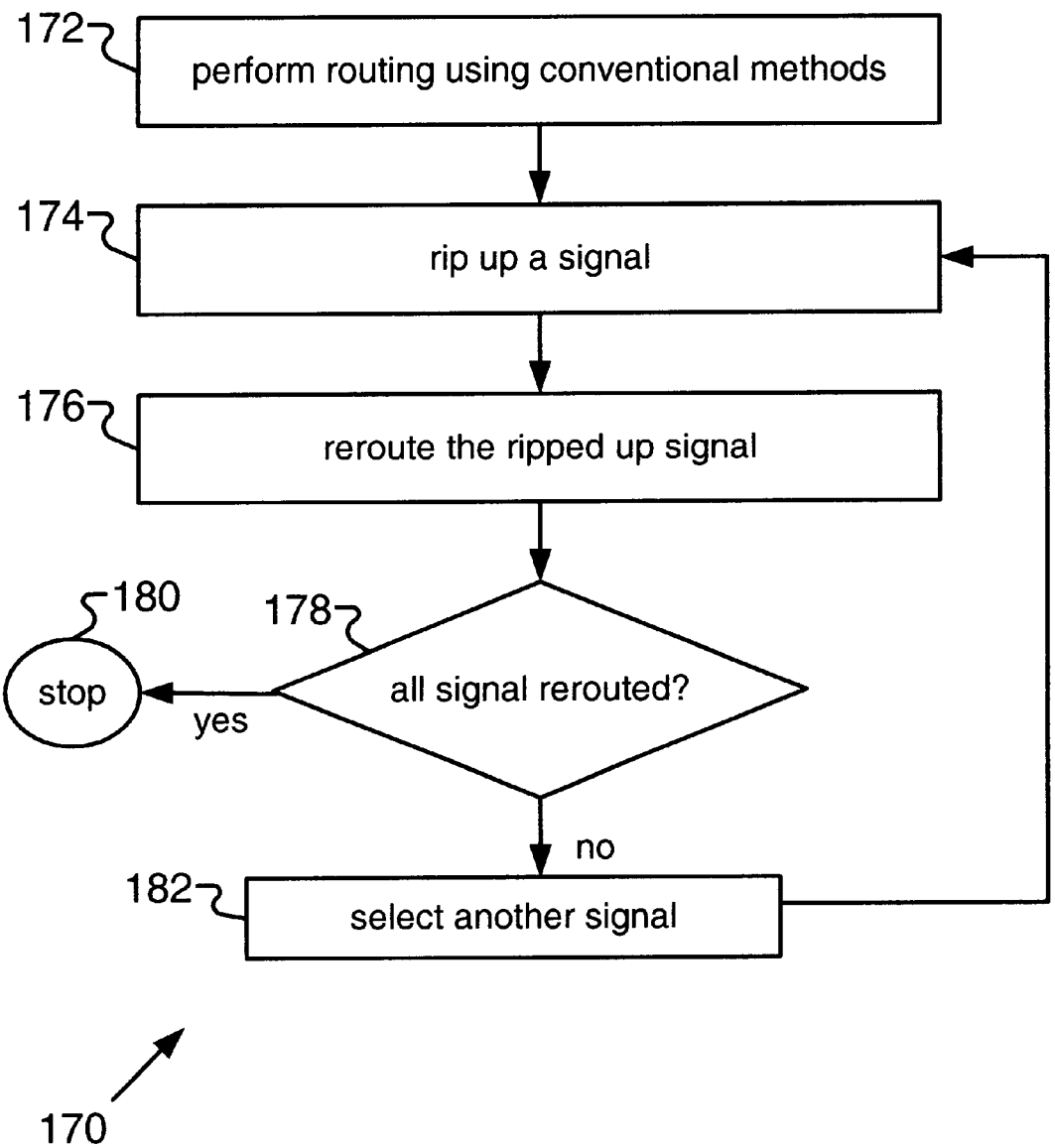
FIG. 3 is a flow chart showing another method of the present invention that can use the operation of FIG. 2.

Note that since each signal route tries to pass through as many uncovered pips as possible, it is more likely that routing contention occurs. An operation 170 that can handle this situation is shown in FIG. 3. In step 172, routing is performed using conventional methods. In step 174, a signal is ripped up. In step 176, the signal is rerouted using operation of FIG. 2B. During each rip-up-and-rerouting of a signal, the above method is used to route through as many uncovered PIPs as possible with the routes of other signals being considered obstacles (i.e., to be avoided in routing). In step 178, operation 170 determines whether all signals have been rerouted. Operation 170 terminates after rerouting all signals (step 180). Otherwise, a new signal is selected (step 182), and operation 170 branches back to step 174. This incremental rip-up-and-rerouting process improves the PIP coverage, while still guarantees a routing solution.

A database can also be used in another embodiment of the present invention. This database records the number of times a PIP has been visited in previous routings (as opposed to whether a PIP has been covered). The database can be used to avoid expansion into areas containing frequently visited PIPs (thereby increasing the chance of finding uncovered PIPs).

Figure 4A:
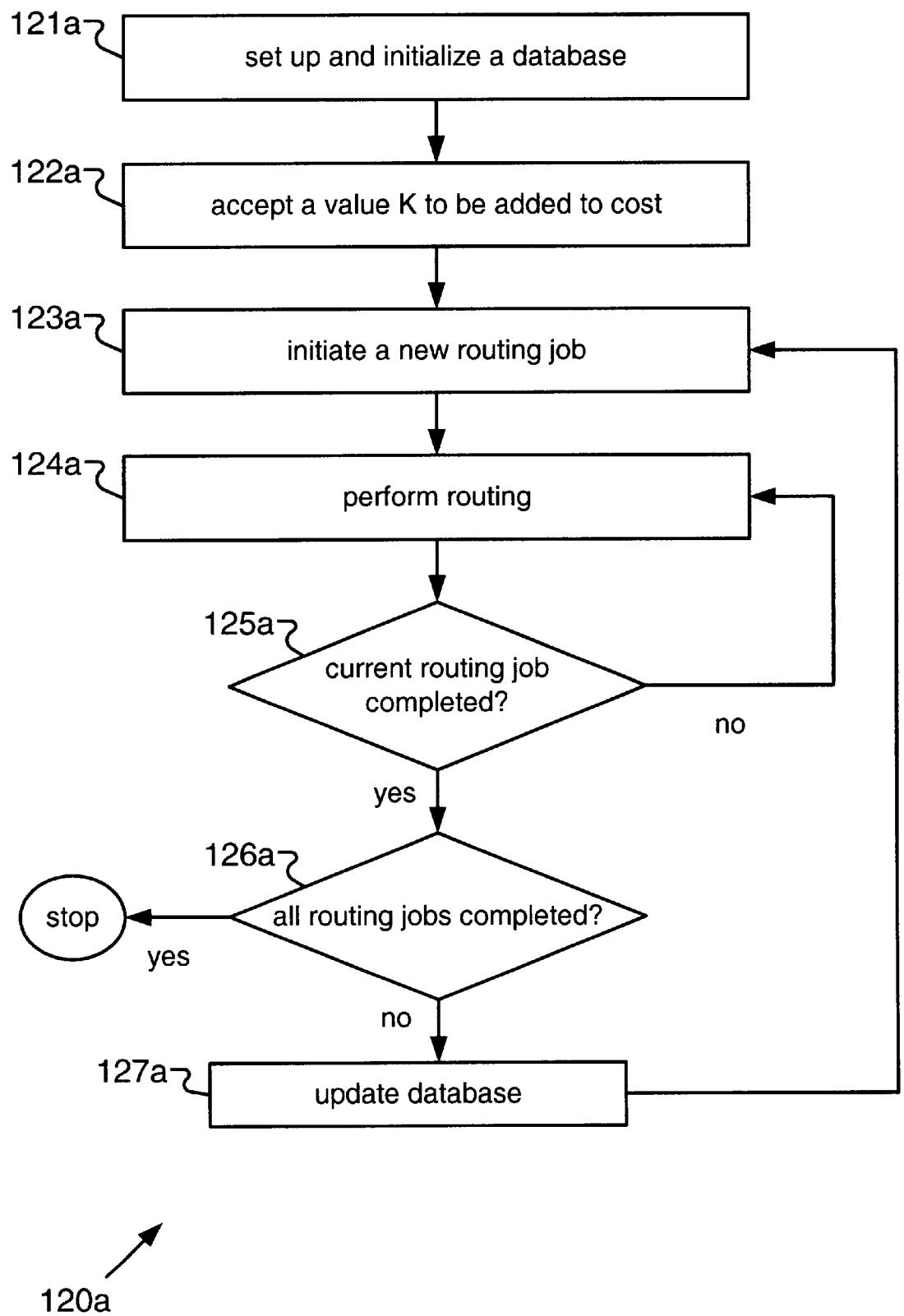
FIG. 4A is a flow chart showing another operation of the present invention that can increase the number of PIPs covered in a routing.

FIG. 4A is a flow chart showing an operation 120a of the present invention. In step 121a, a database (or other type of files) is set up. A field "count" is associated with each PIP to store the number of times the PIP has been used in previous routings. The database is initialized by setting the value of "count" for each PIP equal to zero. In step 122a, a cost value (K) is accepted from a user (or generated from other operations). This value is used to modify the expansion process of a router. Steps 123a to 127a of FIG. 4A perform similar operations of steps 123–127 of FIG. 2A.

Figure 4B:
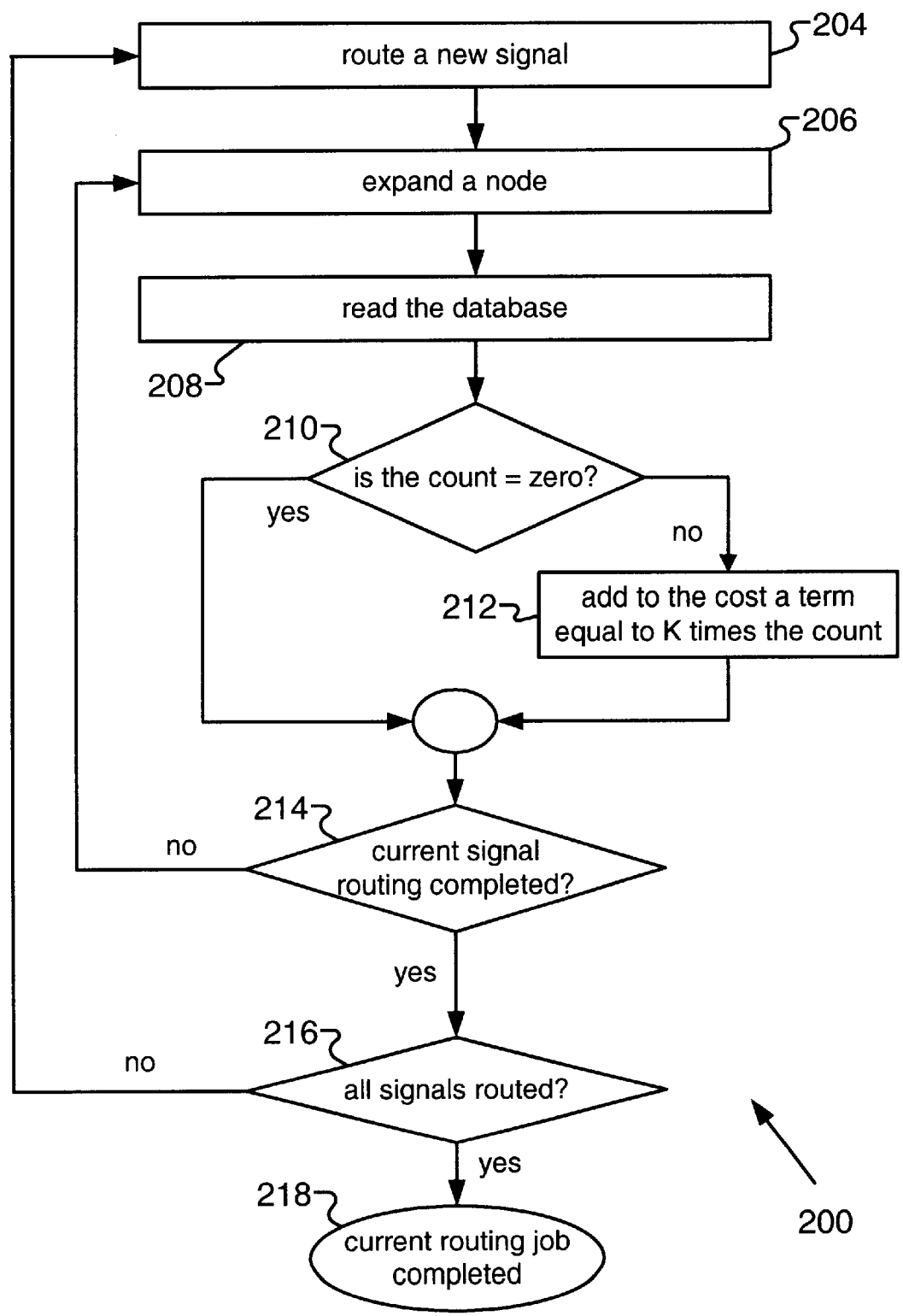
FIG. 4B is a flow chart showing the details of a portion of the routing operation of FIG. 4A.

FIG. 4B is a flow chart 200 showing the details of steps 124a and 125a in FIG. 4A. In step 204, a new signal is routed. In step 206, a node is expanded. In step 208, the database is read. In step 210, the "count" of the PIP associated with the node is read from the database. If the count value is equal to zero, the cost of the node is not changed, and flow chart 200 goes to step 214 (i.e., determining whether the current signal routing is completed). If the count value is not equal to zero, a term equal to K times the count value is added to the base cost of the node. Flow chart 200 then goes to step 214 (i.e., determining whether the current signal routing is completed). If the signal routing is not completed, a new node is expanded (i.e., return to step 206). If the signal routing is completed, it is determined whether all the signals have been routed (step 216). If not all the signals have been routed, a new signal is obtained (i.e., return to step 204). If all the signals have been routed, the current routing job is completed (step 218).

A refinement of this embodiment can be made. If the latest routing run encounters a sufficient number of PIPs with count values equal to zero (indicating a lot of uncovered PIPs), it is desirable to use the same costs to perform one or more routing runs. This is because the routing based on these costs may venture into a new region not reached by previous routings. In this case, the database is not updated. Additional runs are performed using the old database values. When the number of PIPs with count values equal to zero falls below a predetermined number, the database is then updated with the results of all these runs. Because this update incorporates the results of the intervening runs, the count values of some of the PIPs may need to be increased by more than one.

It should be noted that in an actual implementation of the present invention, the method to adjust costs shown in FIGS. 2B and 4B can be used together.

It can be seen from the above description that a novel method for increasing the number of covered PIP has been disclosed. Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

What is claimed is:

1. A method for increasing the number of covered programmable interconnect points in a routing, comprising:
   setting up a file that stores information indicating whether a programmable interconnect point has been covered;
   accepting a value; and
   routing a plurality of nodes, including a step of expanding from a first node to a second node, comprising:
      determining whether the first and the second nodes are connected through an uncovered programmable interconnect point;
      applying a modified cost to the second node if the first node and a second node are connected through an uncovered programmable interconnect point, the modified cost is related to the value; and
      performing routing using the modified cost.

2. The method of claim 1 wherein the modified cost is substantially equal to cost of the first node plus base cost of the second node minus the value.

3. The method of claim 1 wherein the modified cost is substantially equal to cost of the second node if the cost of the second node is smaller than cost of the first node plus base cost of the second node minus the value.

4. A method for increasing the number of covered programmable interconnect points in a routing, comprising:
   setting up a file that stores information indicating whether a programmable interconnect point has been covered;
   accepting a value;
   accepting a routed pattern;
   ripping up one signal from the routed pattern; and
   routing a plurality of nodes associated with the signal, including a step of expanding from a first node to a second node, comprising:
      determining whether the first and the second nodes are connected through an uncovered programmable interconnect point;
      applying a modified cost to the second node if the first node and a second node are connected through an uncovered programmable interconnect point, the modified cost is related to the value; and
      performing routing using the modified cost.

5. The method of claim 4 wherein the modified cost is substantially equal to cost of the first node plus base cost of the second node minus the value.

6. The method of claim 4 wherein the modified cost is substantially equal to cost of the second node if the cost of the second node is smaller than cost of the first node plus base cost of the second node minus the value.

7. A method for increasing the number of covered programmable interconnect points in a routing, comprising:
   setting up a file that stores a count for each the programmable interconnect points;
   accepting a value;
   performing a routing run of the design, comprising:
      for each of the nodes reached in the routing run, calculating a new cost by adding to a base cost a term equal to a product of the value and the count for one of the programmable interconnect points associated with the node; and
      routing using the new cost; and
   updating the file at the end of the routing run.

8. The method of claim 7 wherein the updating step increases the count of each visited programmable interconnect point by a predetermined number.

9. The method of claim 7 wherein the performing step is repeated more than one time, and the file is updated after more than one routing run.

* * * * *